(12) United States Patent
Yamada et al.

(10) Patent No.: US 9,803,282 B2
(45) Date of Patent: Oct. 31, 2017

(54) VAPOR PHASE GROWTH APPARATUS

(71) Applicant: NuFlare Technology, Inc., Kanagawa (JP)

(72) Inventors: Takumi Yamada, Kanagawa (JP); Yuusuke Sato, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 620 days.

(21) Appl. No.: 14/301,703

(22) Filed: Jun. 11, 2014

(65) Prior Publication Data

US 2014/0366803 A1    Dec. 18, 2014

(30) Foreign Application Priority Data

Jun. 13, 2013  (JP) ................................ 2013-124847

(51) Int. Cl.
*C23C 16/455*  (2006.01)
*C30B 25/16*  (2006.01)
(Continued)

(52) U.S. Cl.
CPC .. *C23C 16/45565* (2013.01); *C23C 16/45574* (2013.01); *C23C 16/52* (2013.01);
(Continued)

(58) Field of Classification Search
CPC ........ C23C 16/45565; C23C 16/45574; C23C 16/52; C30B 25/165; C30B 25/14; H01L 21/0254
See application file for complete search history.

(56) References Cited

U.S. PATENT DOCUMENTS 3,701,682 A * 10/1972 Gartman et al. ... C23C 16/45561
117/102
5,595,606 A * 1/1997 Fujikawa .......... C23C 16/45561
118/715
(Continued)

FOREIGN PATENT DOCUMENTS

JP         10158841 A2    6/1998
JP         2001-081569    3/2001
(Continued)

OTHER PUBLICATIONS

Korean Office Action dated Jul. 14, 2016 issued in the corresponding Korean patent application No. 10-2014-072118 and its English translation thereof.
(Continued)

*Primary Examiner* — Jeffrie R Lund
(74) *Attorney, Agent, or Firm* — Rankin, Hill & Clark LLP (57) ABSTRACT

A vapor phase growth apparatus of an embodiment includes: a reaction chamber; a shower plate disposed in the upper portion of the reaction chamber to supply a gas into the reaction chamber; and a support portion disposed below the shower plate inside the reaction chamber to place a substrate thereon. Then, the shower plate includes a plurality of first and second lateral gas passages disposed within different horizontal planes and first and second gas ejection holes connected to the first and second lateral gas passages. Further, the shower plate includes a center lateral gas passage that passes through a position directly above the rotation center of the support portion and third gas ejection holes connected to the center lateral gas passage. Then, the gases ejected from the first and second gas ejection holes and the center gas ejection holes are independently controllable.

14 Claims, 8 Drawing Sheets

(51) Int. Cl.
*C30B 25/14* (2006.01)
*C23C 16/52* (2006.01)
*H01L 21/02* (2006.01)

(52) U.S. Cl.
CPC ............ *C30B 25/14* (2013.01); *C30B 25/165* (2013.01); *H01L 21/0254* (2013.01)

(56) References Cited

U.S. PATENT DOCUMENTS

| | | | | |
|---|---|---|---|---|
| 5,958,140 | A * | 9/1999 | Arami | C23C 16/45502 118/715 |
| 6,086,677 | A * | 7/2000 | Umotoy | C23C 16/45514 118/715 |
| 6,089,472 | A * | 7/2000 | Carter | C23C 16/455 239/422 |
| 6,206,972 | B1 * | 3/2001 | Dunham | C23C 16/45565 118/715 |
| 6,302,964 | B1 * | 10/2001 | Umotoy | C23C 16/45514 118/715 |
| 6,626,998 | B1 * | 9/2003 | Dunham | C23C 16/45565 118/715 |
| 6,800,139 | B1 * | 10/2004 | Shinriki | C23C 16/409 118/715 |
| 7,018,940 | B2 * | 3/2006 | Dunham | C23C 16/455 118/715 |
| 7,976,631 | B2 * | 7/2011 | Burrows | C23C 16/45565 118/715 |
| 8,303,713 | B2 * | 11/2012 | Belousov | C23C 16/45574 118/715 |
| 8,409,352 | B2 * | 4/2013 | Kuribayashi | C23C 16/325 118/715 |
| 8,460,466 | B2 * | 6/2013 | Gurary | C23C 16/4407 118/715 |
| 8,882,913 | B2 * | 11/2014 | Byun | C23C 16/40 118/715 |
| 9,534,724 | B2 * | 1/2017 | Jiang | F16L 53/00 |
| 9,624,603 | B2 * | 4/2017 | Yamada | C23C 16/303 |
| 2001/0021414 | A1 * | 9/2001 | Morishima | C23C 16/4404 427/248.1 |
| 2002/0059904 | A1 * | 5/2002 | Doppelhammer | C23C 16/45565 118/715 |
| 2003/0037802 | A1 * | 2/2003 | Nakahara | C23C 16/18 134/1.1 |
| 2003/0200929 | A1 | 10/2003 | Otsuki | |
| 2004/0191413 | A1 * | 9/2004 | Park | C23C 16/45527 427/255.28 |
| 2005/0092248 | A1 * | 5/2005 | Lee | C23C 16/45565 118/715 |
| 2006/0175011 | A1 * | 8/2006 | Shinriki | C23C 16/4405 156/345.29 |
| 2007/0148349 | A1 * | 6/2007 | Fukada | C23C 16/45565 427/248.1 |
| 2007/0272154 | A1 * | 11/2007 | Amikura | C23C 16/45565 118/719 |
| 2009/0095221 | A1 * | 4/2009 | Tam | C23C 16/45565 118/715 |
| 2009/0095222 | A1 * | 4/2009 | Tam | C23C 16/45565 118/723 R |
| 2009/0169744 | A1 * | 7/2009 | Byun | C23C 16/40 427/255.28 |
| 2009/0178616 | A1 * | 7/2009 | Byun | C23C 16/45519 118/715 |
| 2010/0119727 | A1 * | 5/2010 | Takagi | C23C 16/45521 427/532 |
| 2010/0330781 | A1 * | 12/2010 | Sasaki | C23C 16/325 438/478 |
| 2011/0030615 | A1 * | 2/2011 | Griffin | C23C 16/4405 118/666 |
| 2011/0048325 | A1 * | 3/2011 | Choi | C23C 16/452 118/712 |
| 2011/0052833 | A1 * | 3/2011 | Hanawa | C23C 16/4404 427/534 |
| 2011/0244663 | A1 * | 10/2011 | Su | C23C 16/301 438/478 |
| 2011/0253044 | A1 * | 10/2011 | Tam | C23C 16/45519 118/666 |
| 2012/0000490 | A1 * | 1/2012 | Chung | B08B 7/0035 134/22.12 |
| 2012/0067971 | A1 * | 3/2012 | Byun | C23C 16/45565 239/106 |
| 2013/0052804 | A1 * | 2/2013 | Song | C23C 16/45565 438/478 |
| 2013/0152853 | A1 * | 6/2013 | Suzuki | C30B 25/165 117/88 |
| 2014/0209015 | A1 * | 7/2014 | Yamada | C30B 25/12 117/98 |
| 2014/0366803 | A1 * | 12/2014 | Yamada | C23C 16/52 118/713 |
| 2014/0370691 | A1 * | 12/2014 | Yamada | C30B 25/14 438/478 |
| 2015/0011077 | A1 * | 1/2015 | Yamada | H01L 21/0262 438/478 |
| 2015/0013594 | A1 * | 1/2015 | Yamada | C30B 25/165 117/102 |
| 2015/0054521 | A1 * | 2/2015 | Horiike | G01N 27/70 324/464 |
| 2015/0221507 | A1 * | 8/2015 | Won | H01L 21/02565 438/104 |
| 2015/0221508 | A1 * | 8/2015 | Kurita | H01L 21/02565 438/104 |

FOREIGN PATENT DOCUMENTS

| | | |
|---|---|---|
| JP | 2001226773 A2 | 8/2001 |
| JP | 2004536224 | 12/2004 |
| JP | 2010238810 A2 | 10/2010 |
| JP | 2012059866 A2 | 3/2012 |
| KR | 2003008658 | 1/2003 |
| KR | 20120033264 A | 4/2012 |
| TW | 554427 | 9/2003 |

OTHER PUBLICATIONS

Taiwanese Office Action dated Jun. 1, 2016 issued in the corresponding Taiwanese patent application No. 103117491 and its English translation thereof.
Korean Office Action dated Dec. 28, 2015 issued in the corresponding Korean patent application No. 10-2014-0072118 and its English translation thereof.
Japanese Office Action dated Mar. 7, 2017 issued in the corresponding Japanese patent application No. 2013-124847 and its English translation.

* cited by examiner

FIG.5A
BB CROSS-SECTION

FIG.5B
CC CROSS-SECTION

FIG.5C
DD CROSS-SECTION

VAPOR PHASE GROWTH APPARATUS

CROSS-REFERENCE TO RELATED APPLICATION

This application is based upon and claims the benefit of priority from Japanese Patent Applications No. 2013-124347, filed on Jun. 13, 2013, the entire contents of which are incorporated herein by reference.

FIELD OF THE INVENTION

Embodiments described herein relate generally to a vapor phase growth apparatus that forms a film by supplying a gas to a substrate.

BACKGROUND OF THE INVENTION

As a method of forming a high-quality semiconductor film, there is known an epitaxial growth technique of growing a single-crystal film on a substrate such as a wafer by the vapor phase growth. In a vapor phase growth apparatus that uses the epitaxial growth technique, a wafer is placed on a support portion inside a reaction chamber that is maintained in a normal pressure state or a reduced pressure state. Then, a process gas such as a source gas as a raw material for a film formation process is supplied from, for example, a shower plate of an upper portion of the reaction chamber to the surface of the wafer while heating the wafer. Thus, a thermal reaction of the source gas occurs on the surface of the wafer, and hence an epitaxial single-crystal film is formed on the surface of the wafer.

In recent years, a semiconductor device of GaN (gallium nitride) has been gaining attention as a material of a light emitting device or a power device. As the epitaxial growth technique that forms a GaN-based semiconductor, a metal organic chemical vapor deposition (MOCVD) is known. In the metal organic chemical vapor deposition, for example, organic metal such as trimethylgallium (TMG), trimethylindium (TMI), and trimethylaluminum (TMA) or ammonia ($NH_3$) is used as the source gas. Also, there is a case in which hydrogen ($H_2$) is used as a separation gas in order to suppress the reaction between the source gas.

In order to uniformly form a film on the surface of the wafer in the epitaxial growth technique, especially in MOCVD, it is important to appropriately mix the source gas, the separation gas, or the like and to supply the resultant gas to the surface of the wafer in a uniformly rectified state. JP 2001-81569 A discloses a configuration in which different gases are separated in different gas diffusion chambers until the source gas is introduced into the reaction chamber in order to appropriately mix the different gases.

SUMMARY OF THE INVENTION

A vapor phase growth apparatus according to an aspect of the present disclosure includes: a reaction chamber; a support portion provided inside the reaction chamber, the support portion configured to place a substrate thereon; a shower plate disposed in the upper portion of the reaction chamber, the shower plate configured to supply a gas into the reaction chamber, the shower plate including: a plurality of first lateral gas passages disposed within a first horizontal plane, the first lateral gas passages extending in parallel to each other, a plurality of first longitudinal gas passages connected to the first lateral gas passages, the first longitudinal gas passages extending in a longitudinal direction, the first longitudinal gas passages including first gas ejection holes at a reaction chamber side of the shower plate, a plurality of second lateral gas passages disposed within a second horizontal plane above the first horizontal plane, the second lateral gas passages extending in parallel to each other in a same direction as that of the first lateral gas passages, a plurality of second longitudinal gas passages connected to the second lateral gas passages, the second longitudinal gas passages extending in the longitudinal direction while passing between the first lateral gas passages, the second longitudinal gas passages including second gas ejection holes at the reaction chamber side of the shower plate, a center lateral gas passage extending in parallel in the same direction as that of the first and second lateral gas passages, the center lateral gas passage passing through a position directly above the rotation center of the support portion, and a plurality of center longitudinal gas passages connected to the center lateral gas passage, the center longitudinal gas passages extending in the longitudinal direction, the center longitudinal gas passages including center gas ejection holes at the reaction chamber side of the shower plate; a first gas supply line connected to the first lateral gas passages, the first gas supply line configured to supply a first process gas to the first lateral gas passages; a second gas supply line connected to the second lateral gas passages, the second gas supply line configured to supply a second process gas to the second lateral gas passages; a center gas supply line connected to the center lateral gas passage, the center gas supply line configured to supply a center process gas to the center lateral gas passage; a first flow amount adjustment unit connected to the first gas supply line; a second flow amount adjustment unit connected to the second gas supply line; and a center flow amount adjustment unit connected to the center gas supply line.

DETAILED DESCRIPTION OF THE EMBODIMENTS

Hereinafter, embodiments will be described with reference to the drawings.

Furthermore, in the specification, the gravity direction in the state where a vapor phase growth apparatus is provided so as to form a film is defined as the "down", and the opposite direction is defined as the "up". Accordingly, the "lower portion" indicates the position of the gravity direction with respect to the reference, and the "downside" indicates the gravity direction with respect to the reference. Then, the "upper portion" indicates the position in the direction opposite to the gravity direction with respect to the reference, and the "upside" indicates the direction opposite to the gravity direction with respect to the reference. Further, the "longitudinal direction" indicates the gravity direction.

Further, in the specification, the "horizontal plane" indicates a plane perpendicular to the gravity direction.

Further, in the specification, the "process gas" generally corresponds to the gas used to form a film on a substrate, and corresponds to, for example, the concept including a source gas, a carrier gas, a separation gas, and the like.

(First Embodiment)

A vapor phase growth apparatus of the embodiment includes a reaction chamber, a support portion that is provided inside the reaction chamber so as to place a substrate thereon, and a shower plate that is disposed in the upper portion of the reaction chamber so as to supply a gas into the reaction chamber. Then, the shower plate includes a plurality of first lateral gas passages that are disposed within the horizontal plane so as to extend in parallel to each other and a plurality of first longitudinal gas passages that are connected to the first lateral gas passages so as to extend in the longitudinal direction and include first gas ejection holes at the side of the reaction chamber. Then, the shower plate includes second lateral gas passages that are disposed within the horizontal plane so as to extend in parallel to each other in the same direction as that of each of the first lateral gas passages and a plurality of second longitudinal gas passages that are connected to the second lateral gas passages so as to extend in the longitudinal direction while passing between the first lateral gas passages and include second gas ejection holes at the side of the reaction chamber. Further, the shower plate includes a center lateral gas passage that extends in parallel in the same direction as that of each of the first and second lateral gas passages so as to pass through a position directly above the rotation center of the support portion and a plurality of center longitudinal gas passages that are connected to the center lateral gas passage so as to extend in the longitudinal direction and include center gas ejection holes at the side of the reaction chamber. The vapor phase growth apparatus of the embodiment further includes a first gas supply line that is connected to the first lateral gas passages so as to supply a first process gas thereto, a second gas supply line that is connected to the second lateral gas passages so as to supply a second process gas thereto, a center gas supply line that is connected to the center lateral gas passage so as to supply a center process gas thereto, a first flow amount adjustment unit that is connected to the first gas supply line, a second flow amount adjustment unit that is connected to the second gas supply line, and a center flow amount adjustment unit that is connected to the center gas supply line.

With the above-described configuration, the vapor phase growth apparatus of the embodiment may increase the arrangement density of the gas ejection holes by narrowing the gap between the gas ejection holes ejecting the process gas into the reaction chamber. At the same time, the vapor phase growth apparatus of the embodiment may equalize the flow amount distribution of the gas ejected from the gas election holes by increasing the cross-sectional area of the lateral gas passage so that the fluid resistance of the gas passage decreases until the process gas reaches the gas ejection hole. Further, the vapor phase growth apparatus of the embodiment may independently control the flow amount of the process gas ejected from the vicinity of the position directly above the rotation center of the support portion on which the substrate is placed. Thus, according to the vapor phase growth apparatus of the embodiment, it is possible to grow a film having excellent uniformity in film thickness or film quality on the substrate.

Hereinafter, a case will be described in which the epitaxial growth of GaN (gallium nitride) is performed by MOCVD (Metal Organic Chemical Vapor Deposition).

Figure 1:
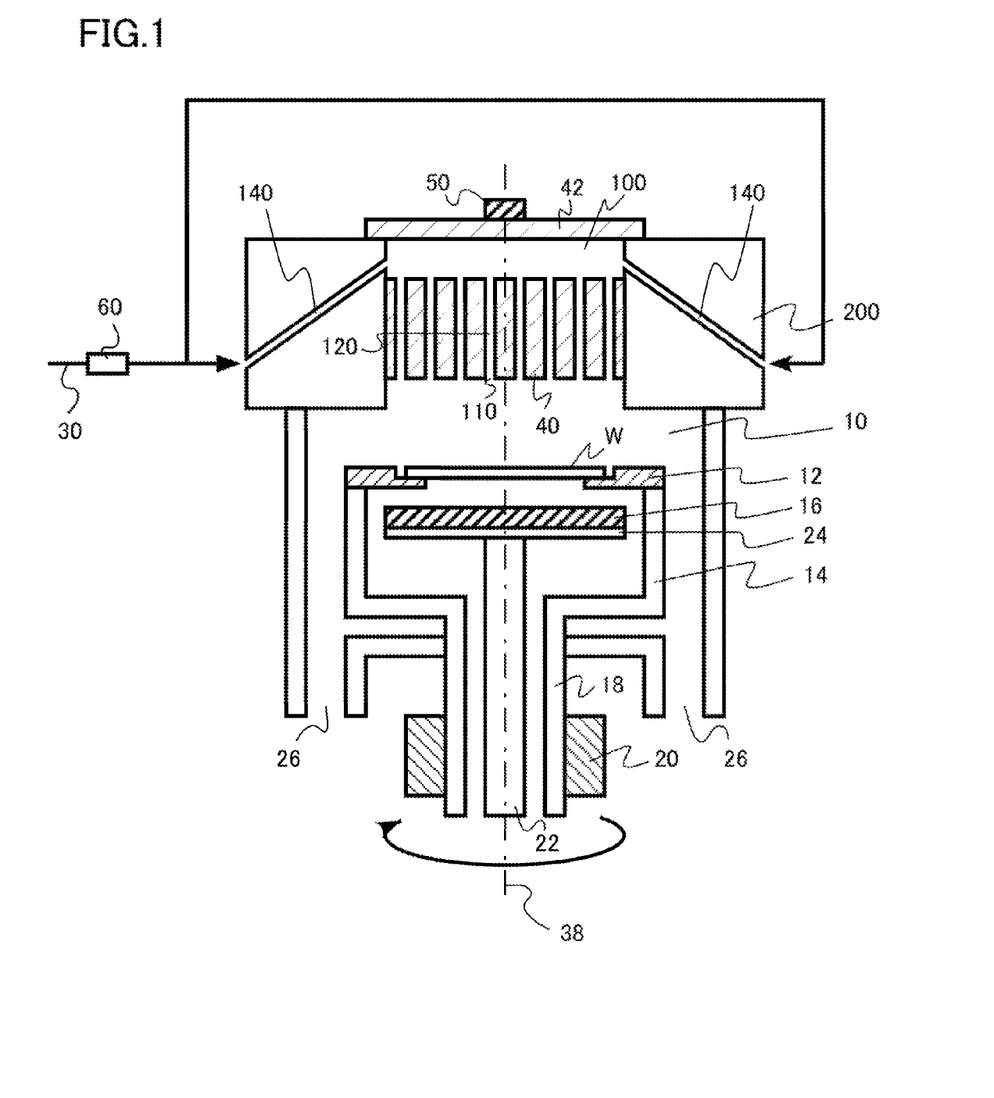
FIG. 1 is a schematic cross-sectional view illustrating a vapor phase growth apparatus of a first embodiment.
Figure 2:
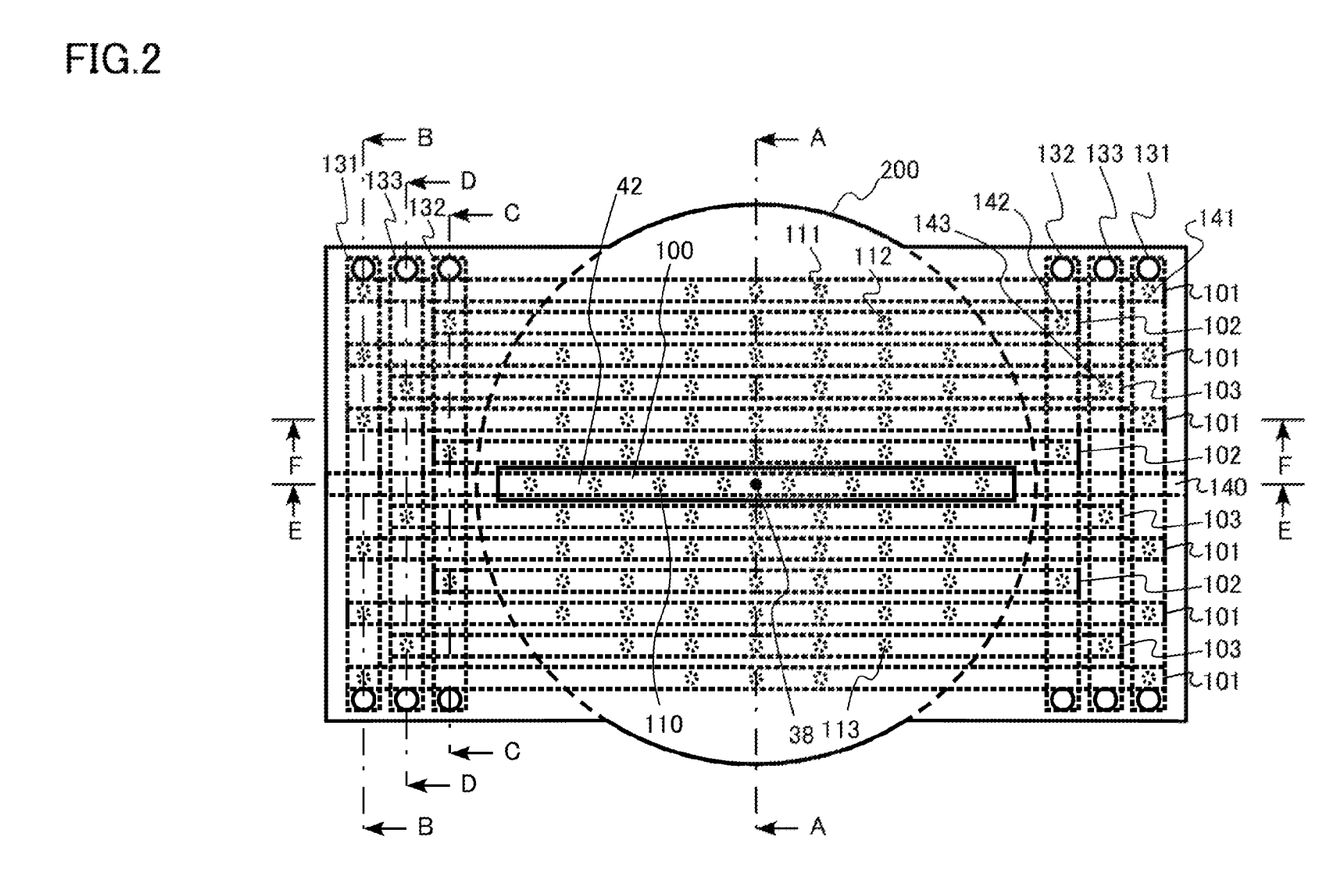
FIG. 2 is a schematic plan view illustrating a shower plate of the first embodiment.
Figure 3:
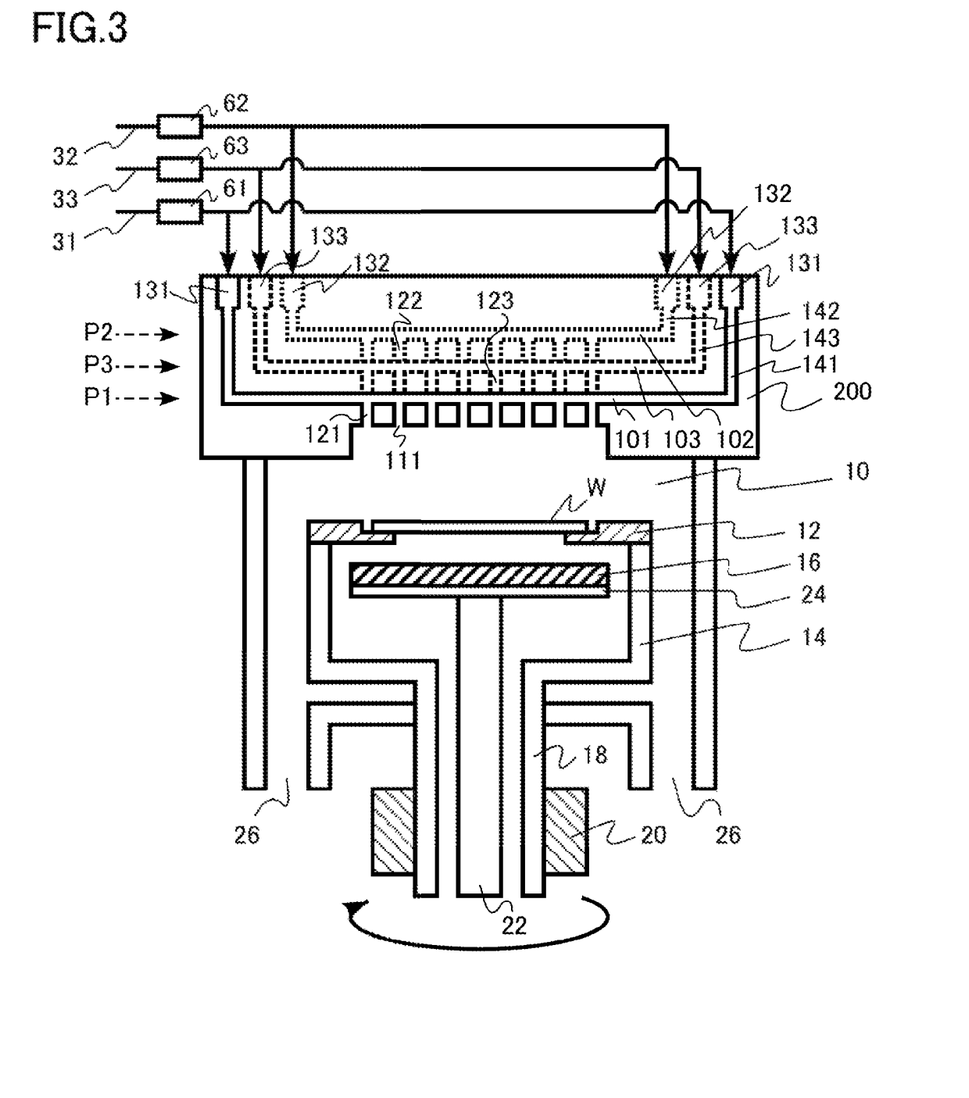
FIG. 3 is a schematic cross-sectional view illustrating the vapor phase growth apparatus of the first embodiment.

FIGS. 1 and 3 are schematic cross-sectional views illustrating the vapor phase growth apparatus of the embodiment. FIG. 2 is a schematic top view obtained when the shower plate of the embodiment is viewed from the upside. FIG. 1 is a cross-sectional view taken along the line EE of FIG. 2, and FIG. 3 is a cross-sectional view taken along the line FF of FIG. 2. The vapor phase growth apparatus of the embodiment is a single wafer type epitaxial growth apparatus.

As illustrated in FIG. 1, the epitaxial growth apparatus of the embodiment includes a reaction chamber 10 that is formed as, for example, stainless cylindrical hollow body. Then, the epitaxial growth apparatus includes a shower plate 200 that is disposed in the upper portion of the reaction chamber 10 and supplies a process gas into the reaction chamber 10.

Further, the epitaxial growth apparatus includes a support portion 12 that is disposed below the shower plate 200 inside the reaction chamber 10 and is rotatable while a semiconductor wafer (a substrate) W is placed thereon. The support portion 12 is, for example, an annular holder that has an opening formed at the center portion or a susceptor contacting the substantially entire rear surface of the semiconductor wafer W.

Further, a rotation unit 14 that rotates while the support portion 12 is disposed on the upper surface thereof and a heater that serves as a heating unit 16 for heating the wafer W placed on the support portion 12 by the radiation heat are provided below the support portion 12. Here, a rotation shaft 18 of the rotation unit 14 is connected to a rotational driving mechanism 20 at the lower position thereof. Then, the rotation shaft 18 is rotated by the rotational driving mechanism 20. Further, the rotation shaft 18 rotates the rotation unit 14 and the support portion 12. Accordingly, the semiconductor wafer W may be rotated at, for example, several tens of rpm to several thousands of rpm while the center serves as the rotation center.

It is desirable that the diameter of the cylindrical rotation unit 14 be substantially equal to the outer peripheral diameter of the support portion 12. Furthermore, the rotation shaft 18 is rotatably provided at the bottom portion of the reaction chamber 10 through a vacuum seal member.

Then, the heating unit 16 is provided while being fixed onto a support base 24 fixed to a support shaft 22 penetrating the inside of the rotation shaft 18. Electric power is supplied to the heating unit 16 by a current introduction terminal and an electrode (not illustrated). The support base 24 is provided with, for example, a push-up pin (not illustrated) that is used to attach or detach the semiconductor wafer W to or from the annular holder.

Further, the bottom portion of the reaction chamber 10 is provided with a gas exhausting portion 26 that discharges a reaction product obtained by the reaction of a source gas on the surface of the semiconductor wafer W and a residual gas of the reaction chamber 10 to the outside of the reaction chamber 10. Furthermore, the gas exhausting portion 26 is connected to a vacuum pump (not illustrated).

Then, the epitaxial growth apparatus of the embodiment includes a first gas supply line 31 that supplies a first process gas, a second gas supply line 32 that supplies a second process gas, a third gas supply line 33 that supplies a third process gas, and a center gas supply line 30 that supplies a center process gas. The first gas supply line 31 is connected with a first flow amount adjustment unit 61, the second gas supply line 32 is connected with a second flow amount adjustment unit 62, the third gas supply line 33 is connected with a third flow amount adjustment unit 63, and the center gas supply line 30 is connected with a center flow amount adjustment unit 60. Each of the first flow amount adjustment unit 61, the second flow amount adjustment unit 62, the third flow amount adjustment unit 63, and the center flow amount adjustment unit 60 is configured as, for example, a mass flow controller, a flow amount adjustment valve, or the combination of a plurality of valves and a plurality of mass flow controllers. The first flow amount adjustment unit 61, the second flow amount adjustment unit 62, the third flow amount adjustment unit 63, and the center flow amount adjustment unit 60 respectively independently control the flow amounts of the first to third process gases and the center process gas introduced into the reaction chamber 10.

For example, in a case where a single-crystal film of GaN is formed on the semiconductor wafer W by MOCVD, for example, hydrogen ($H_2$) as a separation gas is supplied as the first process gas. Further, for example, ammonia ($NH_3$) as a source gas of nitrogen (N) is supplied as the second process gas. Further, for example, a gas obtained by diluting trimethylgallium (TMG) as a source gas of Ga (gallium) by hydrogen ($H_2$) as a carrier gas is supplied as the third process gas.

The center process gas is, for example, a process gas that is the same kind as that of the first or second process gas. For example, hydrogen ($H_2$) as a separation gas is supplied as the center process gas.

Here, the separation gases serving as the first process gas and the center process gas are gases that are ejected from first gas ejection holes 111 and center gas ejection holes 110 so as to separate the second process gases (herein, ammonia) ejected from second gas ejection holes 112 and the third process gases (herein, TMG) ejected from third gas ejection holes 113. For example, it is desirable to use a gas that has insufficient reactivity with the second process gas and the third process gas. As described above, the separation gas is, for example, hydrogen. Also, for example, an inert gas such as nitrogen and argon may be used.

Furthermore, in the single wafer type epitaxial growth apparatus illustrated in FIG. 1, a wafer exit/entrance and a gate valve (not illustrated) through which the semiconductor wafer is inserted and extracted are provided at the side wall position of the reaction chamber 10. Then, the semiconductor wafer W may be carried by a handling arm between, for example, a load lock chamber (not illustrated) connected to the gate valve and the reaction chamber 10. Here, for example, the handling arm formed of synthetic quart may be inserted into the space between the shower plate 200 and the wafer support portion 12.

Figure 4:
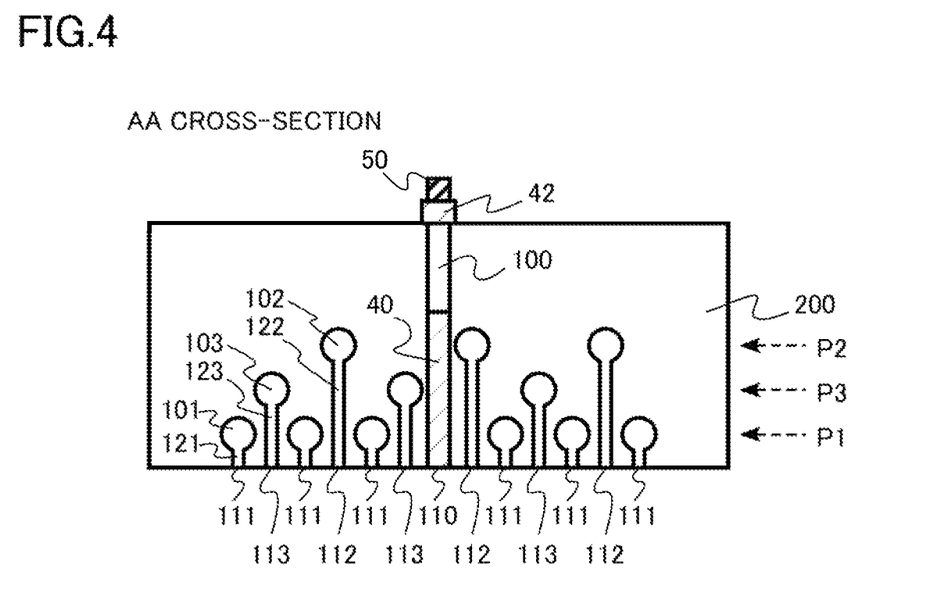
FIG. 4 is a cross-sectional view taken along the line AA of the shower plate of FIG. 2.

Hereinafter, the shower plate 200 of the embodiment will be described in detail. FIG. 2 is a schematic top view illustrating the shower plate of the embodiment. FIG. 4 is a cross-sectional view taken along the line AA of FIG. 2, and FIGS. 5A, 5B, and 5C are cross-sectional views taken along the lines BB, CC, and DD of FIG. 2.

The shower plate 200 has, for example, a plate shape with a predetermined thickness. The shower plate 200 is formed of, for example, a metal material such as stainless steel or aluminum alloy. The lower surface of the shower plate 200, that is, the surface near the reaction chamber 10 has a circular shape.

A plurality of first lateral gas passages 101, a plurality of second lateral gas passages 102, a plurality of third lateral gas passages 103, and a single center lateral gas passage 100 are formed inside the shower plate 200. The plurality of first lateral gas passages 101 extend in parallel to each other within the first horizontal plane (P1). The plurality of second lateral gas passages 102 extend in parallel to each other while being disposed within the second horizontal plane (P2) above the first horizontal plane. The plurality of third lateral gas passages 103 extend in parallel to each other while being disposed within the third horizontal plane (P3) above the first horizontal plane and below the second horizontal plane. Alternatively, the second horizontal plane (P2) and the third horizontal plane (P3) may have the same height. The center lateral gas passage 100 extend in parallel to the first to third lateral gas passages 101 to 103 while being disposed within, for example, the horizontal plane that is located above the first horizontal plane and is identical to or above the second horizontal plane. The height of the center lateral gas passage 100 does not need to be related to the height of the first horizontal plane (P1) or the like.

Then, the center lateral gas passage 100 is formed so as to pass through a position directly above the rotation center 38 of the support portion 12. That is, the center lateral gas passage 100 is formed in the radial direction along the vicinity of the center of the shower plate 200. Furthermore, the center lateral gas passage 100 may be formed so as to pass through the vicinity on the rotation center 38 of the support portion 12 in the range where the effect of the embodiment may be expected.

Then, a plurality of first longitudinal gas passages 121 are provided which are connected to the first lateral gas passages 101 so as to extend in the longitudinal direction and include the first gas ejection holes 111 at the side of the reaction chamber 10. Further, a plurality of second longitudinal gas passages 122 are provided which are connected to the second lateral gas passages 102 so as to extend in the longitudinal direction and include the second gas ejection holes 112 at the side of the reaction chamber 10. The second longitudinal gas passages 122 pass between the first lateral gas passages 101. In addition, a plurality of third longitudinal gas passages 123 are provided which are connected to the third lateral gas passages 103 so as to extend in the longitudinal direction and include third gas ejection holes 113 at the side of the reaction chamber 10. The third longitudinal gas passages 123 pass between the first lateral gas passages 101. Further, a plurality of center longitudinal gas passages 120 are provided which are connected to the center lateral gas passage 100 so as to extend in the longitudinal direction and include the center gas ejection holes 110 at the side of the reaction chamber 10.

The first lateral gas passages 101, the second lateral gas passages 102, and the third lateral gas passages 103 are lateral holes that are formed in the horizontal direction inside the plate-shaped shower plate 200. Further, the first longitudinal gas passages 121, the second longitudinal gas passages 122, the third longitudinal gas passages 123, and the center longitudinal gas passages 120 are longitudinal holes that are formed in the vertical direction (the longitudinal direction or the perpendicular direction) inside the plate-shaped shower plate 200.

A first transparent member 40 is formed between the center lateral gas passage 100 and the reaction chamber 10, and the center longitudinal gas passages 120 are formed as the longitudinal holes formed in the first transparent member 40. Further, a second transparent member 42 is formed above the center lateral gas passage 100. In addition, a measurement device 50 is provided above the second transparent member 42 so as to optically monitor the state of the semiconductor wafer (the substrate) W. A plurality of the measurement devices 50 may be provided above the second transparent member 42. The plurality of measurement devices 50 may be used for different measurements.

The first transparent member 40 is a member that is transparent with respect to a predetermined wavelength used in the measurement device 50, and may be formed of, for example, quartz glass. In addition, any material may be used which has sufficient strength, is transparent, and has high tolerance with respect to the process gas or the like. For example, sapphire or the like may be used as a material other than the quartz glass.

The measurement device 50 is, for example, a warpage monitor device that measures the warpage state of the semiconductor wafer by using a laser, a device that measures the film thickness or the film quality of the growing film by a laser, or a radiation thermometer that measures the temperature of the wafer by the radiation from the wafer.

In this way, since the upper and lower portions of the center lateral gas passage 100 are formed by the transparent members, it is possible to directly observe the wafer state during the film formation process by the optical measurement. Accordingly, it is possible to improve the controllability on the wafer temperature or the wafer warpage state during the film formation process.

Figure 5A:
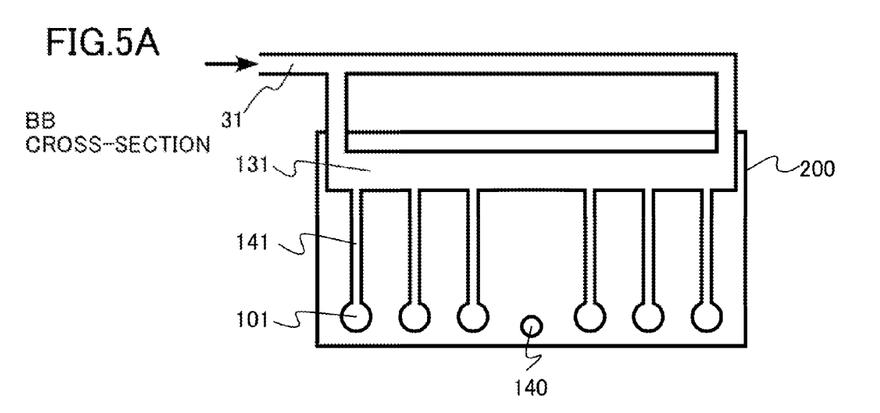
FIGS. 5A, 5B, and 5C are cross-sectional views taken along the lines BB, CC, and DD of the shower plate of FIG. 2.
Figure 5B:
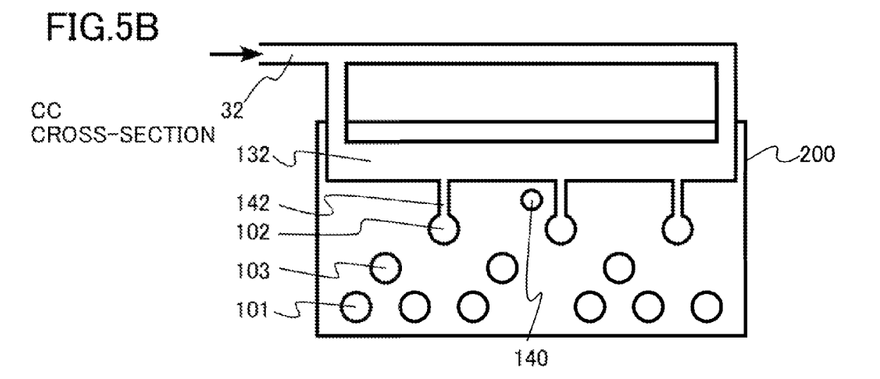
Figure 5C:
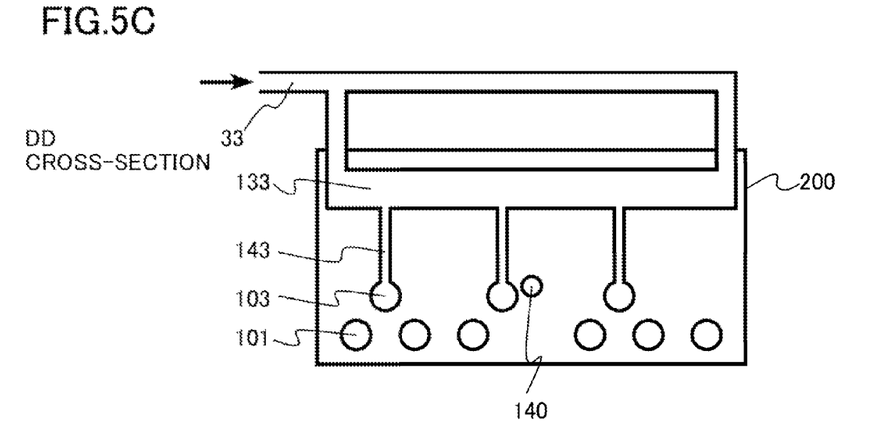

The inner diameters of the first, second, and third lateral gas passages 101, 102, and 103 are larger than the inner diameters of the first, second, and third longitudinal gas passages 121, 122, and 123 respectively corresponding thereto. In FIGS. 5A, 5B, and 5C, the first, second, and third lateral gas passages 101, 102, and 103, the cross-sectional shapes of the first, second, and third longitudinal gas passages 121, 122, and 123 are circular, but the shape is not limited to the circular shape. For example, the other shapes such as an oval shape, a rectangular shape, and a polygonal shape may be employed. Further, the first, second, and third lateral gas passages 101, 102, and 103 may not have the same cross-sectional area. Further, the first, second, and third longitudinal gas passages 121, 122, and 123 may not have the same cross-sectional area.

In FIG. 4, the cross-sectional shape of the center lateral gas passage 100 is rectangular, but may be the other shapes such as a circular shape, an oval shape, and a polygonal shape.

The shower plate 200 includes a first manifold 131 that is connected to the first gas supply line 31 and is provided above the first horizontal plane (P1) and a first connection passage 141 that connects the first manifold 131 and each first lateral gas passage 101 at the end of the first lateral gas passage 101 and extends in the longitudinal direction.

The first manifold 131 has a function of distributing the first process gas supplied from the first gas supply line 31 to the plurality of first lateral gas passages 101 through the first connection passage 141. The first process gases distributed therefrom are introduced from the first gas ejection holes 111 of the plurality of first longitudinal gas passages 121 into the reaction chamber 10. The first manifold 131 may be provided so as to distribute the first process gas to the side surface or the lower surface of the shower plate 200 by the same flow amount.

The first manifold 131 extends in a direction perpendicular to the first lateral gas passage 101, and has, for example, a hollow parallelepiped shape. In the embodiment, the first manifold 131 is provided in both ends of each first lateral gas passage 101, but may also be provided in at least one end thereof.

Further, the shower plate 200 includes a second manifold 132 that is connected to the second gas supply line 32 and is provided above the first horizontal plane (P1) and a second connection passage 142 that connects the second manifold 132 and each second lateral gas passage 102 at the end of the second lateral gas passage 102 and extends in the longitudinal direction.

The second manifold 132 has a function of distributing the second process gas supplied from the second gas supply line 32 to the plurality of second lateral gas passages 102 through the second connection passage 142. The second process gases distributed therefrom are introduced from the second gas ejection holes 112 of the plurality of second longitudinal gas passages 122 to the reaction chamber 10.

The second manifold 132 extends in a direction perpendicular to the second lateral gas passage 102, and has, for example, a hollow parallelepiped shape. In the embodiment, the second manifold 132 is provided in both ends of the second lateral gas passage 102, but may also be provided in at least one end thereof.

Further, the shower plate 200 includes a third manifold 133 that is connected to the third gas supply line 33 and is provided above the first horizontal plane (P1) and a third connection passage 143 that connects the third manifold 133 and each third lateral gas passage 103 at the end of the third lateral gas passage 103 and extends in the perpendicular direction.

The third manifold 133 has a function of distributing the third process gas supplied from the third gas supply line 33 to the plurality of third lateral gas passages 103 through the third connection passage 143. The third process gases distributed therefrom are introduced from the third gas ejection holes 113 of the plurality of third longitudinal gas passages 123 to the reaction chamber 10.

Further, the shower plate 200 includes a center connection passage 140 of which one end is connected to the center gas supply line 30 and the other end is connected to the center lateral gas passage 100. The center process gas that is supplied from the center gas supply line 30 is introduced to the center lateral gas passage 100 through the center connection passage 140, and is introduced from the center gas ejection holes 110 of the center longitudinal gas passages 120 to the reaction chamber 10.

In general, from the viewpoint of ensuring the uniformity of the formation of the film, it is desirable that the flow amount of the process gas ejected from the gas ejection hole provided as a process gas supply port with respect to the shower plate into the reaction chamber 10 be uniform among the gas ejection holes. In the shower plate 200 according to the embodiment, the process gas is distributed in the plurality of lateral gas passages, is distributed in the longitudinal gas passages, and is ejected from the gas ejection holes. With this configuration, it is possible to improve the uniformity of the flow amount of the process gas ejected from the gas ejection holes by a simple structure.

Further, it is desirable that the arrangement density of the gas ejection holes disposed from the viewpoint of the uniform formation of the film be set as large as possible. More than anything else, in the configuration provided with the plurality of lateral gas passages arranged in parallel to each other as in the embodiment, when the density of the gas ejection holes is increased, a trade-off occurs between the arrangement density of the gas ejection hole and the inner diameter of the lateral gas passage.

For this reason, the fluid resistance of the lateral gas passage increases with a decrease in the inner diameter of the lateral gas passage, and the flow amount distribution of the flow amount of the process gas ejected from the gas ejection hole with respect to the extension direction of the lateral gas passage increases. As a result, there is a concern that the uniformity of the flow amount of the process gas ejected from the respective gas ejection holes may be degraded.

According to the embodiment, a layered structure is formed such that the first lateral gas passages 101, the second lateral gas passages 102, and the third lateral gas passages 103 are formed in different horizontal planes. With this structure, the margin with respect to an increase in the inner diameter of the lateral gas passage is improved. Accordingly, it is possible to suppress an increase in the flow amount distribution caused by the inner diameter of the lateral gas passage while ensuring the density of the gas ejection holes. As a result, it is possible to improve the uniformity of the formation of the film by equalizing the flow amount distribution of the process gas ejected into the reaction chamber 10.

Further, in the case of the vapor phase growth apparatus configured to form a film by rotating the support portion 12 on which the substrate is placed, there is a case in which the property, for example, the film thickness of the film formed in the vicinity of the rotation center 38 of the support portion 12 may not be easily controlled. This is because the gas composition in the vicinity of the rotation center 38 of the support portion 12 may be different from other part when different process gases are supplied from the second gas ejection holes 112 and the third gas ejection holes 113.

However, according to the embodiment, the center lateral gas passage 100 is provided directly above the rotation center 38, and hence the process gas may be independently supplied from the center gas ejection hole 110 connected to the center lateral gas passage 100 and provided in the vicinity of the rotation center 38, whereby the gas composition in the vicinity of the rotation center 38 of the support portion 12 may be controlled. Accordingly, it is possible to easily control the property of the film formed in the vicinity of the rotation center 38 of the support portion 12, and hence to improve the uniformity of the film thickness, the film quality, and the like of the film formed on the semiconductor wafer (the substrate) W.

The center longitudinal gas passages 120 and the center gas ejection holes 110 that are provided in the center lateral gas passage 100 may be provided only in the vicinity of the rotation center 38 or may be provided in the entire radial direction. From the viewpoint of the uniformity of the film property, it is desirable that the center longitudinal gas passages 120 and the center gas ejection holes 110 be provided in the entire radial direction.

A vapor growth is performed on the semiconductor wafer as described below by using the single wafer type epitaxial vapor phase growth apparatus. A case in which the epitaxial growth of GaN is performed by the vapor phase growth method of the embodiment will be described by referring to FIGS. 1 to 4.

In a state where a carrier gas is supplied to the reaction chamber 10, a vacuum pump (not illustrated) is operated so that the gas inside the reaction chamber 10 is discharged from the gas exhausting portion 26, and the reaction chamber 10 is maintained in a predetermined pressure, the semiconductor wafer W is placed on the support portion 12 inside the reaction chamber 10. Here, the gate valve (not illustrated) of the wafer exit/entrance of the reaction chamber 10 is opened, and the semiconductor wafer W of the load lock chamber is carried into the reaction chamber 10 by the handling arm. Then, the semiconductor wafer W is placed on the support portion 12 through, for example, the push-up pin (not illustrated), the handling arm is returned to the load lock chamber, and the gate valve is closed.

Then, the discharge of the gas is continued by the vacuum pump, and the first to third process gases and the center process gas are ejected by a predetermined amount from the first to third gas ejection holes 111, 112, and 113 and the center gas ejection holes 110 while the rotation unit 14 is rotated at a necessary speed. The first process gas is supplied from the first gas supply line 31 through the first manifold 131, the first connection passage 141, the first lateral gas passages 101, and the first longitudinal gas passages 121, and is ejected from the first gas ejection holes 111 into the reaction chamber 10. Further, the second process gas is supplied from the second gas supply line 32 through the second manifold 132, the second connection passage 142, the second lateral gas passages 102, and the second longitudinal gas passages 122, and is ejected from the second gas ejection holes 112 into the reaction chamber 10. Further, the third process gas is supplied from the third gas supply line 33 through the third manifold 133, the third connection passage 143, the third lateral gas passages 103, and the third longitudinal gas passages 123, and is ejected from the third gas ejection holes 113 into the reaction chamber 10. Then, the center process gas is supplied from the center gas supply line 30 through the center connection passage 140, the center lateral gas passage 100, and the center longitudinal gas passages 120, and is ejected from the center gas ejection holes 110.

The semiconductor wafer W placed on the support portion 12 is pre-heated to a predetermined temperature by the heating unit 16. Further, the heating output of the heating unit 16 is increased so that the temperature of the semiconductor wafer W increases to the epitaxial growth temperature.

In a case where the growth of GaN is performed on the semiconductor wafer W, for example, the first process gas and the center process gas are hydrogen as a separation gas, the second process gas is ammonia as a source gas of nitrogen, and the third process gas is TMG as a source gas of gallium diluted by hydrogen as a carrier gas. While the temperature increases, ammonia and TMG are not supplied to the reaction chamber 10. For example, only the hydrogen gas is supplied from the first to third gas ejection holes 111, 112, and 113 and the center gas ejection holes 110.

After the temperature reaches the growth temperature, ammonia is supplied to the second gas ejection holes 112, and TMG is supplied to the third gas ejection holes 113. The first to third process gases and the center process gas that are ejected from the first to third gas ejection holes 111, 112, and 113 and the center gas ejection holes 110 are appropriately mixed, and are supplied onto the semiconductor wafer W in a rectified state. Accordingly, for example, a single-crystal film of GaN (gallium nitride) is formed on the surface of the semiconductor wafer W by the epitaxial growth.

Then, when the epitaxial growth ends, the supply of TMG to the third gas ejection holes 113 stops, and the growth of the single-crystal film ends.

After the film is formed, the temperature of the semiconductor wafer W starts to fall. Then, the temperature of the semiconductor wafer W decreases to a predetermined temperature, and the supply of ammonia to the second gas ejection holes 112 is stopped. Here, for example, the rotation of the rotation unit 14 is stopped, and the heating output of the heating unit 16 is returned to the first state so as to decrease the temperature to the pre-heating temperature while the semiconductor wafer W having the single-crystal film formed thereon is placed on the support portion 12.

Next, after the temperature of the semiconductor wafer W is stabilized at a predetermined temperature, the semiconductor wafer W is attached to or detached from the support portion 12 by, for example, the push-up pin. Then, the gate valve is opened again, the handling arm is inserted between the shower plate 200 and the support portion 12, and then the semiconductor wafer W is loaded thereon. Then, the handling arm that loads the semiconductor wafer W thereon is returned to the load lock chamber.

As described above, each film formation process for the semiconductor wafer W ends. In succession, for example, the film formation process on the other semiconductor wafer W may be performed according to the same process sequence as the above-described one.

In the vapor phase growth method of the embodiment, the separation gas that is supplied to the vicinity of the rotation center of the semiconductor wafer W may be controlled independently from the other areas by using the epitaxial growth apparatus illustrated in FIGS. 1 to 4. Accordingly, the film formation characteristic in the vicinity of the rotation center as the characteristic in the film formation process may be easily matched to the film formation characteristic of the other area. Accordingly, the flow of the process gas is uniformly stabilized, and the film formation characteristic in the vicinity of the rotation center is independently controlled, so that a film having excellent uniformity in film thickness or film quality may be formed on the substrate.

(Second Embodiment)

A vapor phase growth apparatus of the embodiment includes a reaction chamber, a shower plate that is disposed in the upper portion of the reaction chamber so as to supply a gas into the reaction chamber, and a support portion that is provided below the shower plate inside the reaction chamber so as to place a substrate thereon. Then, the shower plate includes a plurality of first lateral gas passages that are disposed within the horizontal plane so as to extend in parallel to each other and a plurality of first longitudinal gas passages that are connected to the first lateral gas passages so as to extend in the longitudinal direction and include first gas ejection holes at the side of the reaction chamber. Further, the shower plate includes a plurality of second lateral gas passages that are disposed within the horizontal plane so as to extend in parallel to each other in the same direction as that of each of the first lateral gas passages and a plurality of second longitudinal gas passages that are connected to the second lateral gas passages so as to extend in the longitudinal direction and include second gas ejection holes at the side of the reaction chamber. Then, the shower plate includes a center lateral gas passage that extends in parallel in the same direction as that of each of the first and second lateral gas passages so as to pass through a position directly above the rotation center of the support portion and a plurality of center longitudinal gas passages that are connected to the center lateral gas passage so as to extend in the longitudinal direction and include center gas ejection holes at the side of the reaction chamber. The vapor phase growth apparatus includes a first gas supply line that is connected to the first lateral gas passages so as to supply a first process gas thereto, a second gas supply line that is connected to the second lateral gas passages so as to supply a second process gas thereto, and a center gas supply line that is connected to the center lateral gas passage so as to supply a center process gas thereto. Further, the vapor phase growth apparatus includes a first flow amount adjustment unit that is connected to the first gas supply line; a second flow amount adjustment unit that is connected to the second gas supply line; and a center flow amount adjustment unit that is connected to the center gas supply line.

The vapor phase growth apparatus of the embodiment is different from the first embodiment in that the first and second lateral gas passages are disposed within the same horizontal plane and do not include the layered structure. Even in the embodiment, since the flow of the process gas is uniformly stabilized and the film formation characteristic in the vicinity of the rotation center is independently controlled, it is possible to form a film having excellent uniformity in film thickness and film quality on the substrate.

Figure 6:
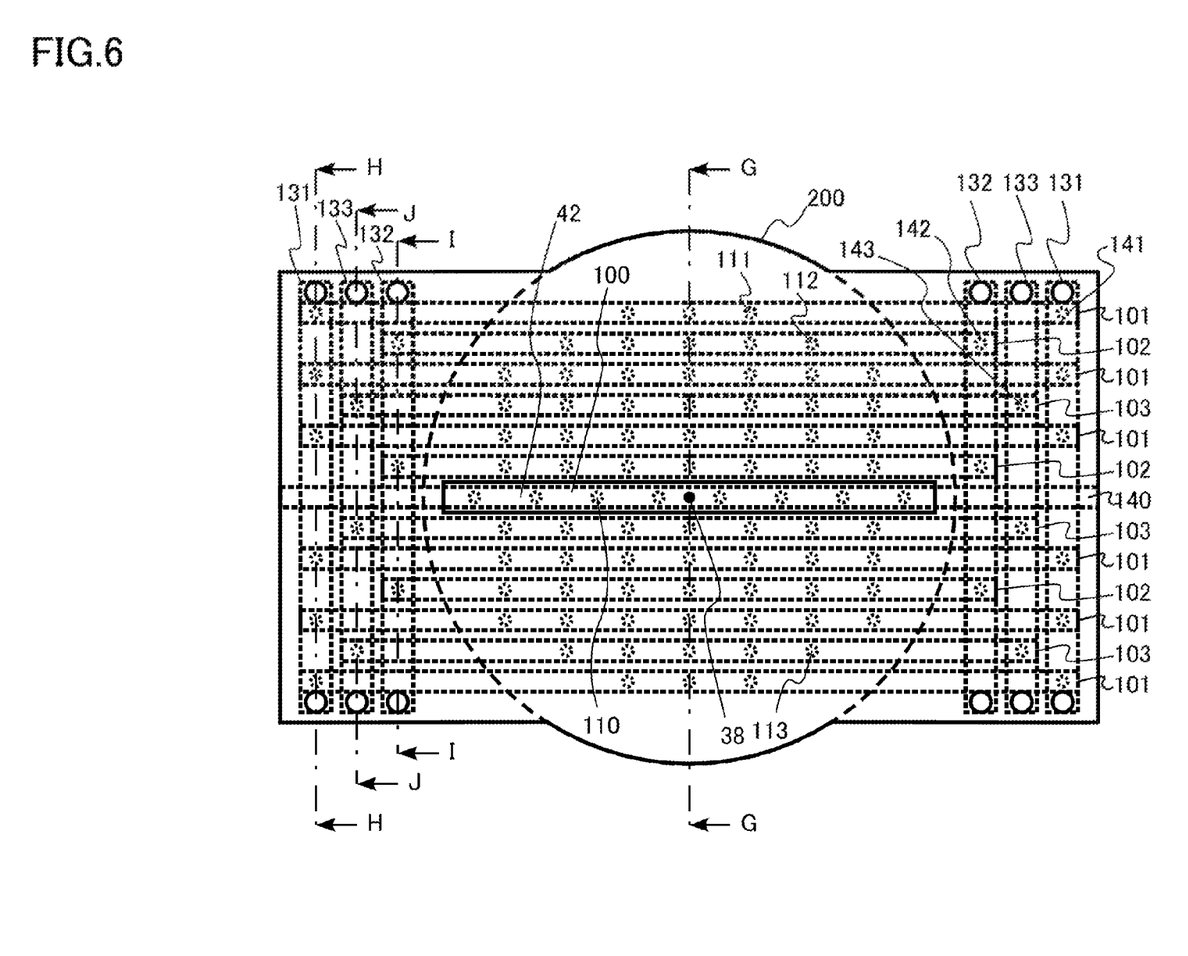
FIG. 6 is a schematic top view illustrating a shower plate of a second embodiment.
Figure 7:
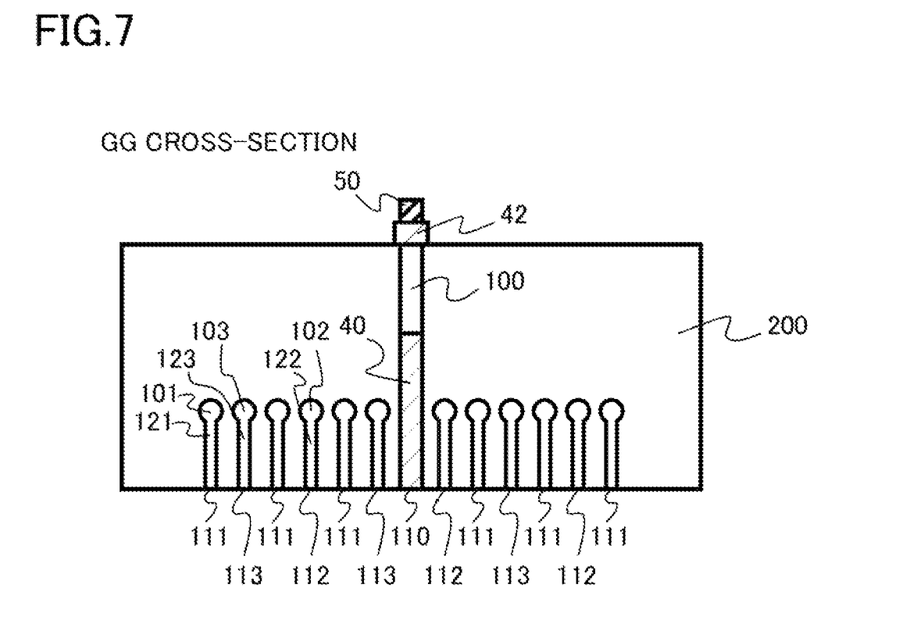
FIG. 7 is a cross-sectional view taken along the line GG of the shower plate of FIG. 6.

Hereinafter, the shower plate 200 of the embodiment will be described in detail. FIG. 6 is a schematic top view illustrating the shower plate of the embodiment. FIG. 7 is a cross-sectional view taken along the line GG of FIG. 6, and FIGS. 8A, 8B, and 8C are cross-sectional views taken along the lines HH, II, and JJ of FIG. 6.

The shower plate 200 has, for example, a plate shape with a predetermined thickness. The shower plate 200 is formed of, for example, a metal material such as stainless steel or aluminum alloy. The lower surface of the shower plate 200, that is, the surface near the reaction chamber 10 has a circular shape.

The plurality of first lateral gas passages 101, the plurality of second lateral gas passages 102, the plurality of third lateral gas passages 103, and the single center lateral gas passage 100 are formed inside the shower plate 200. The plurality of first lateral gas passages 101, the plurality of second lateral gas passages 102, and the plurality of third lateral gas passages 103 extend in parallel to each other while being disposed within the same horizontal plane. For example, the center lateral gas passage 100 extends in parallel to the first to third lateral gas passages 101 to 103 while being disposed within the horizontal plane that is located above the first and second horizontal planes and is identical to or above the second horizontal plane.

Then, the center lateral gas passage 100 is formed so as to pass through a position directly above the rotation center 38 of the support portion 12. That is, the center lateral gas passage 100 is formed in the radial direction along the vicinity of the center of the shower plate 200. The position directly above the rotation center 38 of the support portion 12 indicates the upside in a direction perpendicular to the upper surface of the support portion 12 from the rotation center 38 of the support portion 12.

Then, the plurality of first longitudinal gas passages 121 are provided which are connected to the first lateral gas passages 101 so as to extend in the longitudinal direction and include first gas ejection holes 111 at the side of the reaction chamber 10. Further, the plurality of second longitudinal gas passages 122 are provided which are connected to the second lateral gas passages 102 so as to extend in the longitudinal direction and include second gas ejection holes 112 at the side of the reaction chamber 10. In addition, the plurality of third longitudinal gas passages 123 are provided which are connected to the third lateral gas passages 103 so as to extend in the longitudinal direction and include third gas ejection holes 113 at the side of the reaction chamber 10. Further, the plurality of center longitudinal gas passages 120 are provided which are connected to the center lateral gas passage 100 so as to extend in the longitudinal direction and include center gas ejection holes 110 at the side of the reaction chamber 10.

The first lateral gas passages 101, the second lateral gas passages 102, and the third lateral gas passages 103 are lateral holes that are formed in the horizontal direction inside the plate-shaped shower plate 200. Further, the first longitudinal gas passages 121, the second longitudinal gas passages 122, the third longitudinal gas passages 123, and the center longitudinal gas passages 120 are longitudinal holes that are formed in the vertical direction (the longitudinal direction or the perpendicular direction) inside the plate-shaped shower plate 200.

A first transparent member 40 is formed between the center lateral gas passage 100 and the reaction chamber 10, and the center longitudinal gas passages 120 are formed as the longitudinal holes formed in the first transparent member 40. Further, a second transparent member 42 is formed above the center lateral gas passage 100. In addition, a measurement device 50 is provided above the second transparent member 42 so as to optically monitor the state of the semiconductor wafer (the substrate) W. A plurality of the measurement devices 50 may be provided above the second transparent member 42. The plurality of measurement devices 50 may be used for different measurements.

The first transparent member 40 is a member that is transparent with respect to a predetermined wavelength used in the measurement device 50, and may be formed of, for example, quartz glass. In addition, any material may be used which has sufficient strength, is transparent, and has high tolerance with respect to the process gas or the like. For example, sapphire or the like may be used as a material other than the quartz glass.

The measurement device 50 is, for example, a warpage monitor device that measures the warpage state of the semiconductor wafer by using a laser, a device that measures the film thickness or the film quality of the growing film by a laser, or a radiation thermometer that measures the temperature of the wafer by the radiation from the wafer.

In this way, since the upper and lower portions of the center lateral gas passage 100 are formed by the transparent members, it is possible to directly observe the wafer state during the film formation process by the optical measurement. Accordingly, it is possible to improve the controllability on the wafer temperature or the wafer warpage state during the film formation process.

Figure 8A:
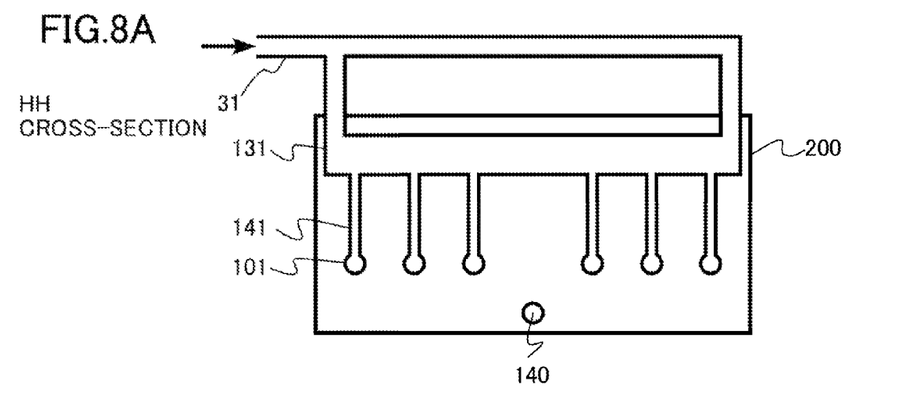
FIGS. 8A, 8B, and 8C are cross-sectional views taken along the lines HH, II, and JJ of the shower plate of FIG. 6.
Figure 8B:
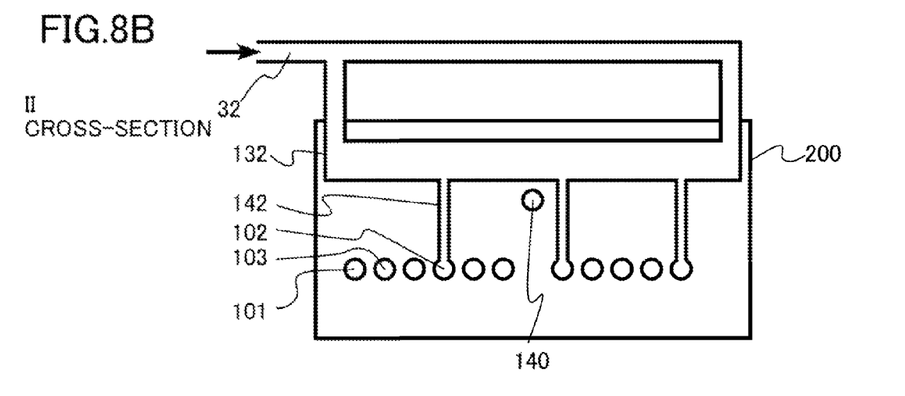
Figure 8C:
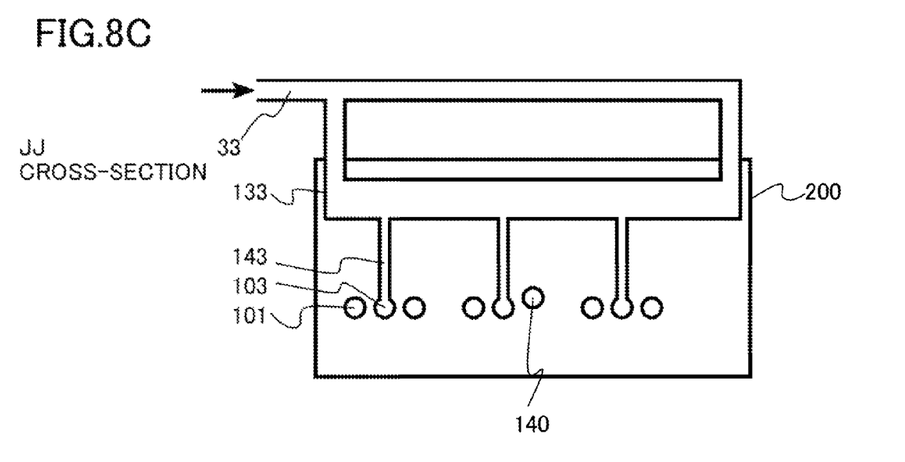

The inner diameters of the first, second, and third lateral gas passages 101, 102, and 103 are larger than the inner diameters of the first, second, and third longitudinal gas passages 121, 122, and 123 respectively corresponding thereto. In FIGS. 8A, 8B, and 8C, the first, second, and third lateral gas passages 101, 102, and 103, the cross-sectional shapes of the first, second, and third longitudinal gas passages 121, 122, and 123 are circular, but the shape is not limited to the circular shape. For example, the other shapes such as an oval shape, a rectangular shape, and a polygonal shape may be employed. Further, the first, second, and third lateral gas passages 101, 102, and 103 may not have the same cross-sectional area. Further, the first, second, and third longitudinal gas passages 121, 122, and 123 may not have the same cross-sectional area.

In FIG. 7, the cross-sectional shape of the center lateral gas passage 100 is rectangular, but may also be the other shapes such as a circular shape, an oval shape, and a polygonal shape.

The shower plate 200 includes a first manifold 131 that is connected to the first gas supply line 31 and is provided above the first horizontal plane (P1) and a first connection passage 141 that connects the first manifold 131 and each first lateral gas passage 101 at the end of the first lateral gas passage 101 and extends in the longitudinal direction.

The first manifold 131 has a function of distributing the first process gas supplied from the first gas supply line 31 to the plurality of first lateral gas passages 101 through the first connection passage 141. The first process gases distributed therefrom are introduced from the first gas ejection holes 111 of the plurality of first longitudinal gas passages 121 into the reaction chamber 10. The first manifold 131 may be provided so as to distribute the first process gas to the side surface or the lower surface of the shower plate 200 by the same flow amount.

The first manifold 131 extends in a direction perpendicular to the first lateral gas passage 101, and has, for example, a hollow parallelepiped shape. In the embodiment, the first manifold 131 is provided in both ends of each first lateral gas passage 101, but may be provided in at least one end thereof.

Further, the shower plate 200 includes a second manifold 132 that is connected to the second gas supply line 32 and is provided above the first horizontal plane (P1) and a second connection passage 142 that connects the second manifold 132 and each second lateral gas passage 102 at the end of the second lateral gas passage 102 and extends in the longitudinal direction.

The second manifold 132 has a function of distributing the second process gas supplied from the second gas supply line 32 to the plurality of second lateral gas passages 102 through the second connection passage 142. The second process gases distributed therefrom are introduced from the second gas ejection holes 112 of the plurality of second longitudinal gas passages 122 to the reaction chamber 10.

The second manifold 132 extends in a direction perpendicular to the second lateral gas passage 102, and has, for example, a hollow parallelepiped shape. In the embodiment, the second manifold 132 is provided in both ends of the second lateral gas passage 102, but may be provided in at least one end thereof.

Further, the shower plate 200 includes a third manifold 133 that is connected to the third gas supply line 33 and is provided above the first horizontal plane (P1) and a third connection passage 143 that connects the third manifold 133 and each third lateral gas passage 103 at the end of the third lateral gas passage 103 and extends in the perpendicular direction.

The third manifold 133 has a function of distributing the third process as supplied from the third gas supply line 33 to the plurality of third lateral gas passages 103 through the third connection passage 143. The third process gases distributed therefrom are introduced from the third gas ejection holes 113 of the plurality of third longitudinal gas passages 123 to the reaction chamber 10.

Further, the shower plate 200 includes a center connection passage 140 of which one end is connected to the center gas supply line 30 and the other end is connected to the center lateral gas passage 100. The center process gas that is supplied from the center gas supply line 30 is introduced to the center lateral gas passage 100 through the center connection passage 140, and is introduced from the center gas ejection holes 110 of the center longitudinal gas passages 120 to the reaction chamber 10.

Furthermore, from the viewpoint of directly observing the state of the wafer (the substrate) during the film formation process by the optical measurement, it is desirable that a first transparent member be formed between the center lateral gas passage and the reaction chamber, the center longitudinal gas passage be formed as longitudinal hole formed in the first transparent member, and a second transparent member be formed between the center lateral gas passage and the upper surface of the shower plate.

Further, it is desirable that a measurement device be provided above the second transparent member so as to optically monitor the state of the substrate.

Further, it is desirable that the first and second transparent members be formed of quartz glass.

Further, it is desirable that the center process gas be a gas that is the same kind as that of the first or second process gas.

As described above, the embodiments have been described with reference to the specific examples. However, the above-described embodiments are merely examples, and do not limit the present disclosure. Further, the components of the embodiments may be appropriately combined with each other.

For example, a case has been described in which the center process gas is the separation gas, but the other gases such as a source gas may be used. In a case where the center process gas is the separation gas and different process gases are supplied from the second gas ejection holes 112 and the third gas ejection holes 113, it is easy to control the gas composition in the vicinity of the rotation center 38 of the support portion 12.

For example, in the embodiments, a case has been described in which four kinds of passes such as the lateral gas passage are provided, but the kind of passes such as the lateral gas passage may be five or more or two or three.

Further, for example, in the embodiments, a case has been described in which the single-crystal film of GaN (gallium nitride) is formed, but the embodiments may be applied to, for example, the case where the single-crystal film of Si (silicon) or SiC (silicon carbide) is formed. The substrate is formed of sapphire, SiC, silicon, or the like. When the growth of AlN (aluminum nitride) is performed, a reaction between trimethylaluminum (TMA) and ammonia of a raw material gas easily occurs in a gas phase state, so that powder of AlN is produced or polymer of the ammonia and the TMA degrades the film quality of the AlN film. Since the separation gas is supplied, it is possible to improve the film quality of AlN by suppressing the reaction between ammonia and TMA in a gas phase state. Even in this case, it is easy to control the film quality or the film thickness in the vicinity of the rotation center 38 of the support portion 12 when the center process gas is the separation gas.

Further, in the embodiments, an example of the single wafer type epitaxial apparatus that forms a film for each wafer has been described, but the vapor phase growth apparatus is not limited to the single wafer type epitaxial apparatus. For example, the embodiments may be also applied to a planetary CVD apparatus that simultaneously forms a film on a plurality of wafers that revolve in a spinning state.

In the embodiments, the apparatus configuration or the manufacturing method which is not directly necessary for the description of the invention is not described, but the apparatus configuration or the manufacturing method which needs to be used may be appropriately selected and used. In addition, all vapor phase growth apparatuses that include the components of the invention and may be appropriately modified in design by the person skilled in the art are included in the scope of the invention. The scope of the invention is defined by the claims and the scope of the equivalent thereof.

What is claimed is:
1. A vapor phase growth apparatus comprising:
a reaction chamber;
a support portion provided inside the reaction chamber, the support portion configured to place a substrate thereon;
a first gas supply line;
a second gas supply line;
a shower plate disposed in the upper portion of the reaction chamber, the shower plate configured to supply a gas into the reaction chamber, the shower plate including:
a pair of first manifolds connected to the first gas supply line,
a plurality of first lateral gas passages connected to the first gas supply line via the first manifolds, the first gas supply line configured to supply a first process gas to the first lateral gas passages, the first lateral gas passages disposed within a first horizontal plane, the first lateral gas passages extending in parallel to each other, the pair of first manifolds provided above the first horizontal plane,
first connection passages extending in the longitudinal direction and connecting the pair of first manifolds and the first lateral gas passages at both ends of the first lateral gas passages,
a plurality of first longitudinal gas passages connected to the first lateral gas passages, the first longitudinal gas passages extending in a longitudinal direction, the first longitudinal gas passages including first gas ejection holes at a reaction chamber side of the shower plate,
a pair of second manifolds connected to the second gas supply line,
a plurality of second lateral gas passages connected to the second gas supply line via the second manifolds, the second gas supply line configured to supply a second process gas to the second lateral gas passages, the second lateral gas passages disposed within a second horizontal plane above the first horizontal plane, the second lateral gas passages extending in parallel to each other in a same direction as that of the first lateral gas passages, the pair of second manifolds provided above the second horizontal plane,
second connection passages extending in the longitudinal direction and connecting the pair of second manifolds and the second lateral gas passages at both ends of the second lateral gas passages,
a plurality of second longitudinal gas passages connected to the second lateral gas passages, the second longitudinal gas passages extending in the longitudinal direction while passing between the first lateral gas passages, the second longitudinal gas passages including second gas ejection holes at the reaction chamber side of the shower plate,
a center lateral gas passage extending in parallel in the same direction as that of the first and second lateral gas passages, the center lateral gas passage passing through a position directly above the rotation center of the support portion, and
a plurality of center longitudinal gas passages connected to the center lateral gas passage, the center longitudinal gas passages extending in the longitudinal direction, the center longitudinal gas passages including center gas ejection holes at the reaction chamber side of the shower plate;

a center gas supply line connected to the center lateral gas passage, the center gas supply line configured to supply a center process gas to the center lateral gas passage;
a first flow amount adjustment unit connected to the first gas supply line;
a second flow amount adjustment unit connected to the second gas supply line; and
a center flow amount adjustment unit connected to the center gas supply line.

2. The apparatus according to claim 1, further comprising:
a first transparent member provided between the center lateral gas passage and the reaction chamber; and
a second transparent member provided above the center lateral gas passage,
wherein the center longitudinal gas passages are formed as longitudinal holes formed in the first transparent member.

3. The apparatus according to claim 2, further comprising:
a measurement device provided above the second transparent member, the measurement device configured to optically monitor the state of the substrate.

4. The apparatus according to claim 2,
wherein the first and second transparent members are formed of quartz glass.

5. The apparatus according to claim 1,
wherein the center process gas is a gas that is the same kind as that of at least one of the first process gas and the second process gas.

6. The apparatus according to claim 1,
wherein the center lateral gas passage is disposed within the horizontal plane above the first horizontal plane and the second horizontal plane.

7. The apparatus according to claim 1, further comprising:
a third gas supply line; and
a third flow amount adjustment unit connected to the third gas supply line;
wherein the shower plate further includes:
a pair of third manifolds connected to the third gas supply line,
a plurality of third lateral gas passages connected to the third gas supply line via the third manifolds, the third gas supply line configured to supply a third process gas to third lateral gas passages, the third lateral gas passages disposed within a third horizontal plane above the first horizontal plane and below the second horizontal plane, the third lateral gas passages extending in parallel to each other in the same direction as that of the first lateral gas passages, the pair of third manifolds provided above the third horizontal plane,
third connection passages extending in the longitudinal direction and connecting the pair of third manifolds and the third lateral gas passages at both ends of the third lateral gas passages, and
a plurality of third longitudinal gas passages connected to the third lateral gas passages, the third longitudinal gas passages extending in the longitudinal direction while passing between the first lateral gas passages, the third longitudinal gas passages including third gas ejection holes at the reaction chamber side of the shower plate.

8. A vapor phase growth apparatus comprising:
a reaction chamber;
a support portion provided inside the reaction chamber, the support portion configured to place a substrate thereon;
a first gas supply line;
a second gas supply line;
a shower plate disposed in the upper portion of the reaction chamber, the shower plate configured to supply a gas into the reaction chamber, the shower plate including:
a pair of first manifolds connected to the first gas supply line,
a plurality of first lateral gas passages connected to the first gas supply line via the first manifolds, the first gas supply line configured to supply a first process gas to the first lateral gas passages, the first lateral gas passages disposed within a horizontal plane, the first lateral gas passages extending in parallel to each other, the pair of first manifolds provided above the horizontal plane,
first connection passages extending in the longitudinal direction and connecting the pair of first manifolds and the first lateral gas passages at both ends of the first lateral gas passages,
a plurality of first longitudinal pas passages connected to the first lateral gas passages, the first longitudinal gas passages extending in a longitudinal direction, the first longitudinal gas passages including first gas ejection holes at a reaction chamber side of the shower plate,
a pair of second manifolds connected to the second gas supply line,
a plurality of second lateral gas passages connected to the second gas supply line via the second manifolds, the second gas supply line configured to supply a second process gas to the second lateral gas passages, the second lateral gas passages disposed within the horizontal plane, the second lateral gas passages extending in parallel to each other in the same direction as that of the first lateral gas passages, the pair of second manifolds provided above the horizontal plane,
second connection passages extending in the longitudinal direction and connecting the pair of second manifolds and the second lateral gas passages at both ends of the second lateral gas passages,
a plurality of second longitudinal gas passages connected to the second lateral gas passages, the second longitudinal gas passages extending in the longitudinal direction while passing between the first lateral gas passages, the second longitudinal gas passages including second gas ejection holes at the reaction chamber side of the shower plate,
a center lateral gas passage extending in parallel in the same direction as that of the first and second lateral gas passages, the center lateral gas passage passing through a position directly above the rotation center of the support portion, and
a plurality of center longitudinal gas passages connected to the center lateral gas passage, the center longitudinal gas passages extending in the longitudinal direction, the center longitudinal gas passages including center gas ejection holes at the reaction chamber side of the shower plate;
a center gas supply line connected to the center lateral gas passage, the center gas supply line configured to supply a center process gas to the center lateral gas passage;
a first flow amount adjustment unit connected to the first gas supply line;

a second flow amount adjustment unit connected to the second gas supply line; and a center flow amount adjustment unit connected to the center gas supply line.

9. The apparatus according to claim 8, further comprising:

a first transparent member provided between the center lateral gas passage and the reaction chamber; and a second transparent member provided above the center lateral gas passage, wherein the center longitudinal gas passages are formed as longitudinal holes formed in the first transparent member.

10. The apparatus according to claim 9, further comprising:

a measurement device provided above the second transparent member, the measurement device configured to optically monitor the state of the substrate.

11. The apparatus according to claim 9, wherein the first and second transparent members are formed of quartz glass.

12. The apparatus according to claim 8, wherein the center process gas is a gas that is the same kind as that of at least one of the first process gas and the second process gas.

13. The apparatus according to claim 8, wherein the center lateral gas passage is disposed within a horizontal plane above the horizontal plane.

14. The apparatus according to claim 8, further comprising:

a third gas supply line; and a third flow amount adjustment unit connected to the third gas supply line;

wherein the shower plate further includes:

a pair of third manifolds connected to the third gas supply line, a plurality of third lateral gas passages connected to the third gas supply line via the third manifolds, the third gas supply line configured to supply a third process gas to third lateral gas passages, the third lateral gas passages disposed within the horizontal plane, the third lateral gas passages extending in parallel to each other in the same direction as that of the first lateral gas passages, the pair of third manifold provided above the horizontal plane, third connection passages extending in the longitudinal direction and connecting the pair of third manifolds and the third lateral gas passages at both ends of the third lateral gas passages, and a plurality of third longitudinal gas passages connected to the third lateral gas passages, the third longitudinal gas passages extending in the longitudinal direction, the third longitudinal gas passages including third gas ejection holes at the reaction chamber side of the shower plate.

* * * * *